(12) United States Patent
Hu et al.

(10) Patent No.: US 8,928,515 B1
(45) Date of Patent: Jan. 6, 2015

(54) ANALOG-TO-DIGITAL CONVERTER AND METHOD OF CONVERTING AN ANALOG SIGNAL TO A DIGITAL SIGNAL

(71) Applicant: Beken Corporation, Shanghai (CN)

(72) Inventors: Desheng Hu, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 14/194,675

(22) Filed: Mar. 1, 2014

(30) Foreign Application Priority Data

Aug. 6, 2013 (CN) .......................... 2013 1 0340630

(51) Int. Cl.
H03M 1/34 (2006.01)
H03M 1/12 (2006.01)
H03M 1/38 (2006.01)
H03M 1/10 (2006.01)

(52) U.S. Cl.
CPC ................ H03M 1/124 (2013.01); H03M 1/38 (2013.01); H03M 1/10 (2013.01)
USPC .......................................... 341/163; 341/155

(58) Field of Classification Search
CPC .......... H03M 1/124; H03M 1/10; H03M 1/38
USPC .................. 341/155, 144, 163, 122, 118, 120
See application file for complete search history.

(56) References Cited

U.S. PATENT DOCUMENTS

| | | | | |
|---|---|---|---|---|
| 6,545,625 | B2* | 4/2003 | Hottgenroth | 341/155 |
| 6,556,154 | B1* | 4/2003 | Gorecki et al. | 341/118 |
| 6,882,295 | B2 | 4/2005 | Leung | |
| 7,605,741 | B2* | 10/2009 | Hurrell | 341/163 |
| 8,258,991 | B2 | 9/2012 | Janakiraman | |
| 8,519,876 | B2 | 8/2013 | Lin | |
| 8,552,797 | B2* | 10/2013 | Lin | 327/553 |

OTHER PUBLICATIONS

Li et al., A 12-bit Fully Differential SAR ADC with Dynamic Latch Comparator for Portable Physiological Monitoring Applications, Bulletin of advanced technology research, vol. 5 No. 7/Jul. 2011, pp. 6-9.

* cited by examiner

*Primary Examiner* — Peguy Jean Pierre
(74) *Attorney, Agent, or Firm* — Perkins Coie LLP

(57) ABSTRACT

An analog-to-digital converter (ADC) comprises a sample/hold (S/H) unit, a digital-to-analog converter (DAC), a comparing unit, and a control unit. The S/H unit samples a first analog signal. The control unit comprises a compensating unit. The compensating unit receives an indication signal, and compensates a current bit and all its less significant bits, such that the sum of the current bit and all its less significant bits approximates a bit weight of the current bit, when the indication signal indicates that the comparison result cannot be determined. The compensating unit then outputs the compensated current bit and all its less significant bits together with more significant bits of the current bit.

13 Claims, 8 Drawing Sheets

US 8,928,515 B1

ANALOG-TO-DIGITAL CONVERTER AND METHOD OF CONVERTING AN ANALOG SIGNAL TO A DIGITAL SIGNAL

CLAIM OF PRIORITY

This application claims priority to Chinese Application No. 201310340630.9 entitled "ANALOG-TO-DIGITAL CONVERTER AND METHOD OF CONVERTING AN ANALOG SIGNAL TO A DIGITAL SIGNAL", filed on Aug. 6, 2013 by Beken Corporation, which is incorporated herein by reference.

TECHNICAL FIELD

The present application relates to circuits, and more particularly but not exclusive to an analog-to-digital converter and a method of converting an analog signal to a digital signal.

BACKGROUND

Conventionally, an analog-to-digital converter (ADC) includes a comparator. The comparator is used to compare two input signals and then generate a digital signal (low or high) indicating which of the two input signals is bigger. Under normal comparison, the comparison time of the comparator should be within a predetermined time limit. If the two input signals are very close to each other, a comparison result can hardly be determined within the predetermined time limit, which leads to a very long comparison time.

SUMMARY OF THE INVENTION

In an embodiment, an analog-to-digital converter (ADC) comprises a sample/hold (S/H) unit, a digital-to-analog converter (DAC), a comparing unit, and a control unit. The sample/hold unit samples a first analog signal. The digital-to-analog converter is communicatively coupled to the control unit and converts a feedback signal to a second analog signal. The comparing unit is communicatively coupled to both the sample/hold unit and the digital-to-analog converter, compares the sampled first analog signal with the second analog signal, and generates an indication signal. The indication signal indicates whether a comparison result between the sampled first analog signal and the second analog signal can be determined. The control unit further comprises a compensating unit communicatively coupled to the comparing unit and compensates a current bit corresponding to the comparison result and all its less significant bits, such that the sum of the current bit and all its less significant bits approximates a bit weight of the current bit, when the indication signal indicates that the comparison result cannot be determined. The compensating unit further outputs compensated current bit and all its less significant bits together with more significant bits of the current bit. The control unit further comprises a successive approximation register (SAR) communicatively coupled to the comparing unit. The SAR receives the comparison result from the comparing unit, stores the comparison result, generates the feedback signal according to the comparison result, and feeds the feedback signal back to the digital-to-analog converter, when the indication signal indicates that the comparison result can be determined.

Alternatively, the successive approximation register comprises N number bit registers, and the analog-to-digital converter further comprises N number first D-type flip flops (DFF) connected in serial. A D port of each first DFF receives the indication signal. A Q port of each first DFF is connected to a corresponding bit register of the successive approximation register. A Q negative (QN) port of each DFF is connected to the compensating unit.

Alternatively, each of the bit registers further comprises a second DFF, a first AND gate, a delay unit, a first buffer and a second buffer, wherein in each bit register. A D port of the second DFF receives its corresponding comparison result. A clock port of the second DFF is connected to a Q port of a corresponding first DFF. The delay unit is also connected to the Q port of the corresponding first DFF. A Q port of the second DFF is connected to a first input port of the first AND gate. The delay unit is connected to a second input port of the first AND gate. A third input port of the first AND gate receives a bit reset signal. The Q port of the second DFF is connected to the first buffer. The output port of the first buffer is connected to a second buffer. The output port of the second buffer is connected to the DAC.

Alternatively, the compensating unit compensates the current bit and all its less significant bits by setting the current bit to 1 and resetting all its less significant bits to 0, when the indication signal indicates that the comparison result cannot be determined.

Alternatively, the compensating unit further comprises a second AND gate, an OR gate, a third DFF and a fourth DFF, a third buffer, a fourth buffer and a fifth buffer. A first input port and a second input port of the second AND gate are connected to Q negative (QN) ports of first DFFs for two neighboring bits. An output port of the second AND gate is connected to a first input port of the OR gate. A second input port of the OR gated is connected to a bit register for a less significant bit between the two neighboring bits. An output port of the OR gate is connected to a D port of the third DFF. A Q port of the third DFF is connected to the third buffer. The third buffer is connected to the fourth buffer. A D port of the fourth DFF is connected to the fifth buffer. The fifth buffer is connected to the bit register for the most significant bit (MSB). The Q port of the fourth DFF is connected to the third buffer. Both a clock port of the third DFF and a clock port of the fourth DFF are configured to receive a parallel clock.

Alternatively, the compensating unit compensates the current bit and all its less significant bits by resetting the current bit to 0 and setting all its less significant bits to 1, when the indication signal indicates that the comparison result cannot be determined.

Alternatively, the compensating unit further comprises a second AND gate, a 2-to-1 multiplexer(MUX), a third DFF and a fourth DFF, a third buffer, a fourth buffer and a fifth buffer. A first input port and a second input port of the second AND gate are connected to Q negative (QN) ports of first DFFs for two neighboring bits. An output port of the second AND gate is connected to a selector port of the MUX. A first input port of the MUX is connected to a bit register for a less significant bit between the two neighboring bits. A second input port of the MUX is connected to ground (GND). A Q port of the third DFF is connected to the third buffer. The third buffer is connected to the fourth buffer. A D port of the fourth DFF is connected to the fifth buffer. The fifth buffer is connected to the bit register for the most significant bit (MSB). The Q port of the fourth DFF is connected to the third buffer. Both a clock port of the third DFF and a clock port of the fourth DFF are configured to receive a parallel clock.

In another embodiment, an analog-to-digital converter (ADC) comprises a first sample/hold unit, a second sampling unit, a first digital-to-analog converter, a second digital-to-analog converter, a comparing unit, and a control unit. The first sample/hold(S/H) unit samples a first analog signal. The second sample/hold(S/H) unit samples a second analog signal. The first digital-to-analog converter (DAC) is communicatively coupled to the first sample/hold unit and the control unit, and receives a first feedback signal from the control unit and the sampled first analog signal, and converts the difference between the sampled first analog signal and the first feedback signal to a third analog signal. The second digital-to-analog converter (DAC) is communicatively coupled to the second sample/hold unit and the control unit, receives a second feedback signal from the control unit and the sampled second analog signal, and converts the difference between the sampled second analog signal and the second feedback signal to a fourth analog signal. The comparing unit is communicatively coupled to the first digital-to-analog converter and the second digital-to-analog converter, compares the third analog signal with the fourth analog signal, and generates an indication signal. The indication signal indicates whether a comparison result between the third analog signal and the fourth analog signal can be determined. The control unit further comprises a compensating unit communicatively coupled to the comparing unit and compensates current bit and all its less significant bits, such that the sum of the current bit and all its less significant bits approximates a bit weight of the current bit, when the indication signal indicating that the first comparison result and the second comparison result cannot be determined. The compensating unit further outputs compensated current bit and all its less significant bits together with more significant bits of the current bit. The control unit further comprises a successive approximation register (SAR) communicatively coupled to the comparing unit and receives the comparison result from the comparing unit, stores the comparison result, generates the first feedback signal according to the first comparison result and generates the second feedback signal according to the second comparison result, and feeds the first feedback signal to the first digital-to-analog converter, and feeds the second feedback signal to the second digital-to-analog converter, when the indication signal indicating that the first comparison result and the second comparison result can be determined.

In another embodiment, a method of converting an analog signal to a digital signal comprises sampling the first analog signal; converting the feedback signal to a second analog signal; comparing the sampled first analog signal with the second analog signal; generating an indication signal, the indication signal indicating whether a comparison result between the sampled first analog signal and the second analog signal can be determined; compensating current bit and all its less significant bits, such that the sum of the current bit and all its less significant bits approximates a bit weight of the current bit, when the indication signal indicates that the comparison result cannot be determined; outputting compensated current bit and all its less significant bits together with more significant bits of the current bit; storing the comparison result; and generating the feedback signal according to the comparison result, feeding the feedback signal back, when the indication signal indicates that the comparison result can be determined.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 6:
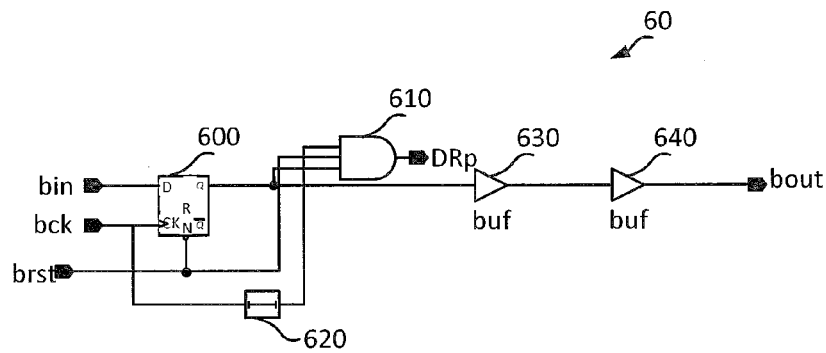
FIG. 6 is a diagram illustrating a circuit of a bit register according to an embodiment of the invention.
Figure 7:
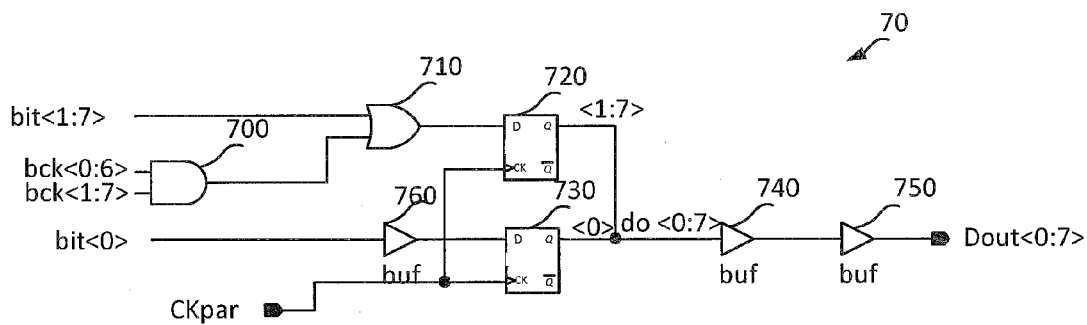
FIG. 7 is a diagram illustrating a circuit of a compensating unit according to an embodiment of the invention.

For clarity, among the figures, those reference signs within angle brackets represent a bundle of node names or port names, while some of the reference signs without angle brackets represent a subset of node name or port name. For example, bck<0:6> in FIG. 7 represents a bundle of node names or port names, including bck<0>, bck<1>, bck<2> . . . bck<6>, while bck in FIG. 6 represents a subset of node name or port name.

Further, among bck<0>, bck<1> . . . bck<6>, for example, bck<0> represents the bit clock for the most significant bit (MSB), and bck<6> represents the bit clock for the least significant bit (LSB).

Figure 1:
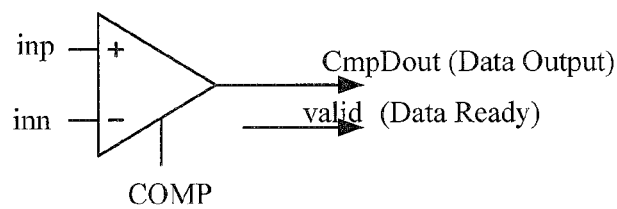
FIG. 1 is a diagram illustrating a comparator according to an embodiment of the invention.

FIG. 1 is a diagram illustrating a comparator according to an embodiment of the invention.

The comparator has two input ports, namely inp and inn. The comparator further has an internal input which is marked as COMP. COMP is the input signal to start the comparison procedure. That is, COMP is a trigger signal. Port inp receives a positive input, while port inn receives a negative input. If the signal COMP triggers the comparator to start compare, the comparator outputs a comparison result which is marked as CmpDout (Data Output). The comparator can also generate a valid signal which is used to indicate whether the comparison result CmpDout can be generated. When two inputs are close to each other, for example, Vinp-Vinn<1 uV, then the comparison result CmpDout cannot be determined.

Figure 2A:
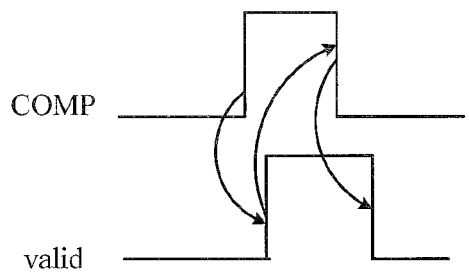
FIG. 2A and FIG. 2B are diagrams illustrating two different comparison statuses for the comparator.
Figure 2B:
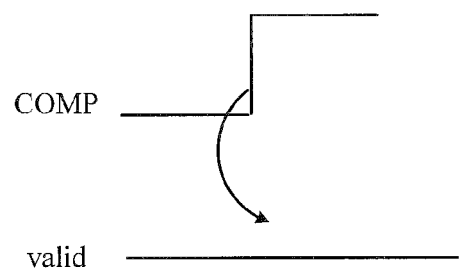

FIG. 2A and FIG. 2B are diagrams illustrating two different comparison statuses for the comparator. FIG. 2A shows a normal comparison status, in which the internal signal COMP has a pulse and the valid signal has a pulse, which means the comparison result CmpDout can be determined. To be specific, a rising edge of the valid signal follows the rising edge of the signal COMP, and a falling edge of the valid signal follows the falling edge of the signal COMP. By contrast, FIG. 2B shows a comparison in metastability. Metastability describes behaviors of certain physical systems that can exist in long lived states that are less stable than the system's most stable state. In FIG. 2B, it can be seen that the internal signal COMP does not have a pulse within the predetermined time, and the valid signal keeps unchanged, which means the comparison result CmpDout cannot be determined.

Figure 3:
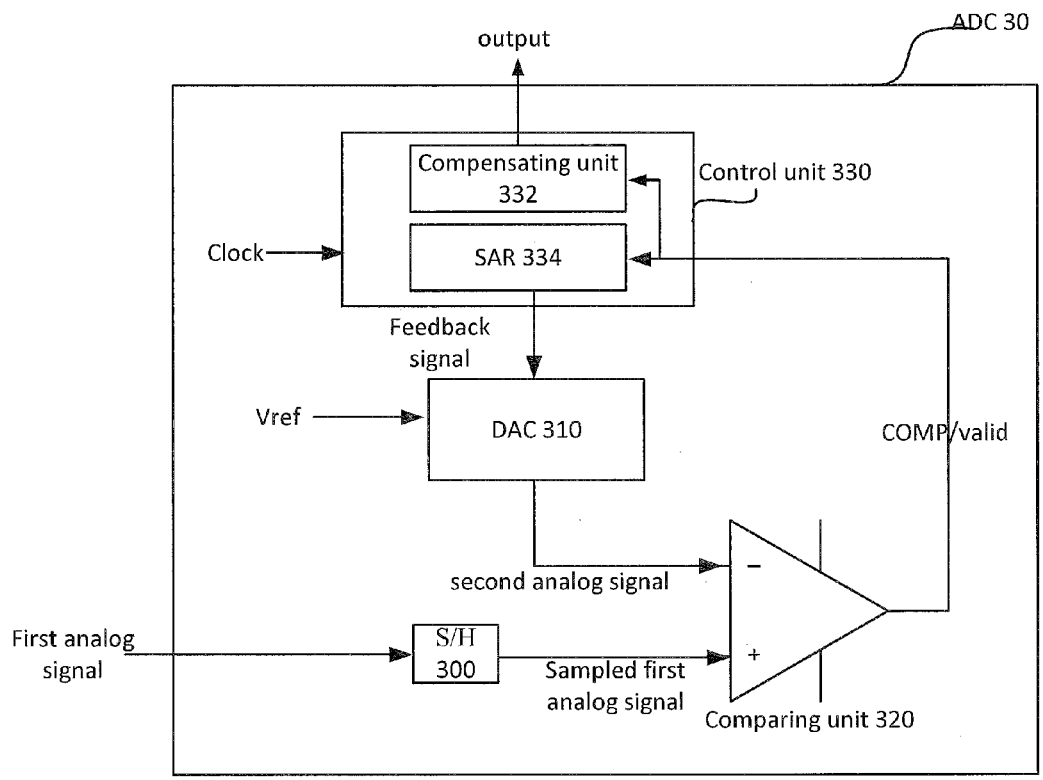
FIG. 3 is a block diagram illustrating an ADC according to an embodiment of the invention.

FIG. 3 is a block diagram illustrating an analog-to-digital converter (ADC) 30 according to an embodiment of the invention. The (ADC) 30 comprises a sample/hold (S/H) unit 300, a digital-to-analog converter (DAC) 310, a comparing unit 320, and a control unit 330.

The sample/hold unit 300 samples the first analog signal. The digital-to-analog converter 310 is communicatively coupled to the control unit 320 and converts a feedback signal to a second analog signal. The comparing unit 320 is communicatively coupled to both the sample/hold unit 300 and the digital-to-analog converter 310. The comparing unit 320 compares the sampled first analog signal with the second analog signal, and generates an indication signal (valid). The indication signal indicates whether a comparison result between the sampled first analog signal and the second analog signal can be determined. The control unit 330 further comprises a compensating unit 332 communicatively coupled to the comparing unit 320 and compensates a current bit corresponding to the comparison result and all its less significant bits, such that the sum of the current bit and all its less significant bits approximates a bit weight of the current bit, when the indication signal indicates that the comparison result cannot be determined.

The compensating unit 332 further outputs compensated current bit and all its less significant bits together with more significant bits of the current bit. The control unit 320 further comprises a successive approximation register (SAR) 334 communicatively coupled to the comparing unit. The SAR 334 receives the comparison result from the comparing unit 320, stores the comparison result, generates the feedback signal according to the comparison result, and feeds the feedback signal back to the digital-to-analog converter 310, when the indication signal indicates that the comparison result can be determined.

The SAR 334 may be an N-bit register. Although there are many variations for implementing the ADC 30, the basic operation is as follows. The first analog signal, for example a voltage signal ($V_{IN}$) is held on by the sample/hold unit 300. To implement a binary search algorithm, the N-bit register 334 is first set to midscale (that is, 100 . . . 0.00, where the Most significant (MSB) is set to 1 and all the other bits less significant than the MSB are set to 0). This forces the DAC 310 output ($V_{DAC}$) to be $V_{REF/2}$, where $V_{REF}$ is the reference voltage provided to the ADC. Those skilled in the art can understand that $V_{DAC}$ is the second analog signal, and $V_{IN}$ is the first analog signal shown in FIG. 3.

A comparison is then performed to determine if $V_{IN}$ is less than, or greater than, $V_{DAC}$. If $V_{IN}$ is greater than $V_{DAC}$, the comparator 320 output is a logic high, or 1, and the MSB of the N-bit register remains at 1. Conversely, if $V_{IN}$ is less than $V_{DAC}$, the comparator output is a logic low and the MSB of the register is cleared (or reset) to logic 0.

The SAR control unit 330 then moves to the next bit down, forces that bit high, and does another comparison. The sequence continues all the way down to the least significant bit (LSB). Once this is done, the conversion is complete and the N-bit digital code is available in the register. The N-bit code is the digital approximation of the sampled input voltage $V_{IN}$.

It should be noted that each turn a bit has been converted, the SAR 334 will feed the comparison result for that specific bit back to the DAC 310 so the $V_{DAC}$ can be adjusted successively, and the next bit can be compared.

Figure 4:
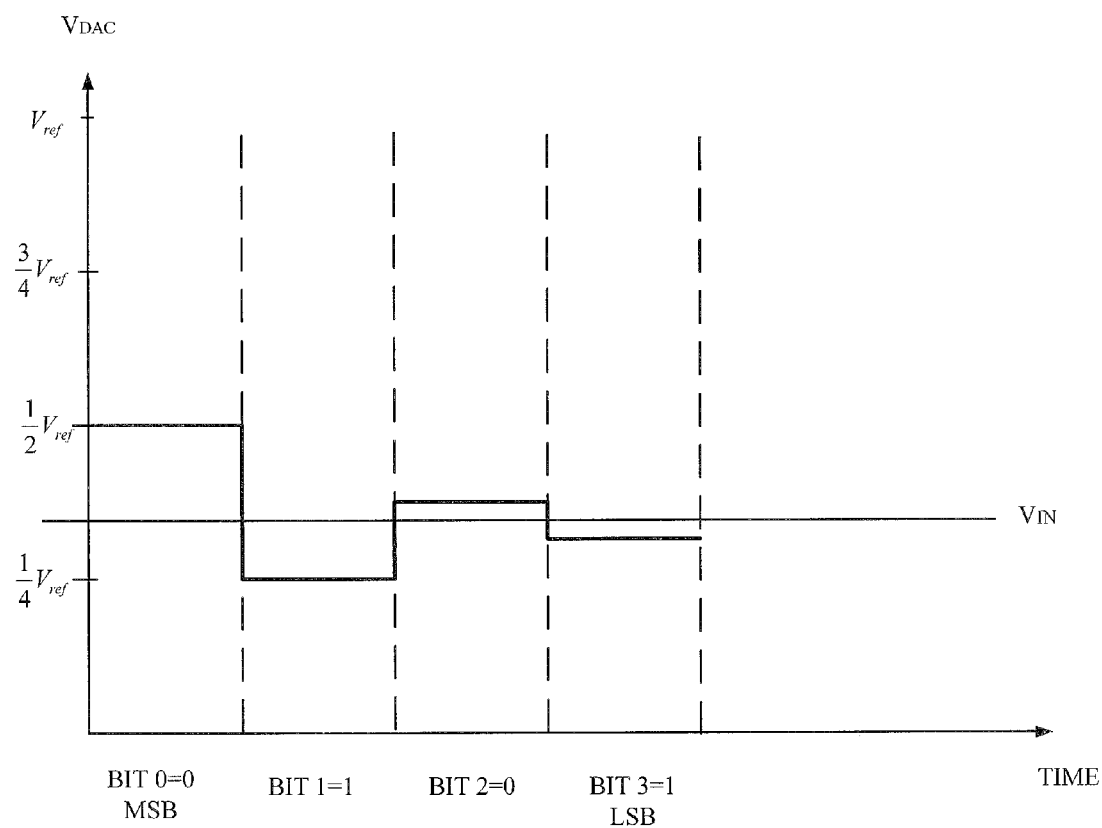
FIG. 4 is a diagram illustrating an example timing of a 4-bit conversion.

FIG. 4 is a diagram illustrating an example timing of a 4-bit conversion. The y-axis (and the bold line in the figure) represents the DAC output voltage. In the example, the DAC at first is set to $1000_2$ ($V_{DAC}=½V_{ref}$). The first comparison shows that $V_{IN}<V_{DAC}(½V_{ref})$. Thus, bit 0 is set to 0. The DAC is then set to $0100_2$ ($V_{DAC}=¼V_{ref}$) and the second comparison is performed. As $V_{IN}>V_{DAC}$, bit 1 remains at 1. The DAC is then set to $0110_2$ ($V_{DAC}=⅜V_{ref}$), and the third comparison is performed. Bit 2 is set to 0, and the DAC is then set to $0101_2$ ($V_{DAC}=5⁄16V_{ref}$) for the final comparison. Finally, bit 3 remains at 1 because $V_{IN}>V_{DAC}$. Bit weight means analog value corresponding to a bit in the digital number. Assume Vref=10 v. Then the bit weight of bit 0=10/2=5V, bit weight of bit 1=10/4=2.5V, bit weight of bit 2=10/8=1.25V, and bit weight of bit 3=10/16=0.625V.

Figure 5:
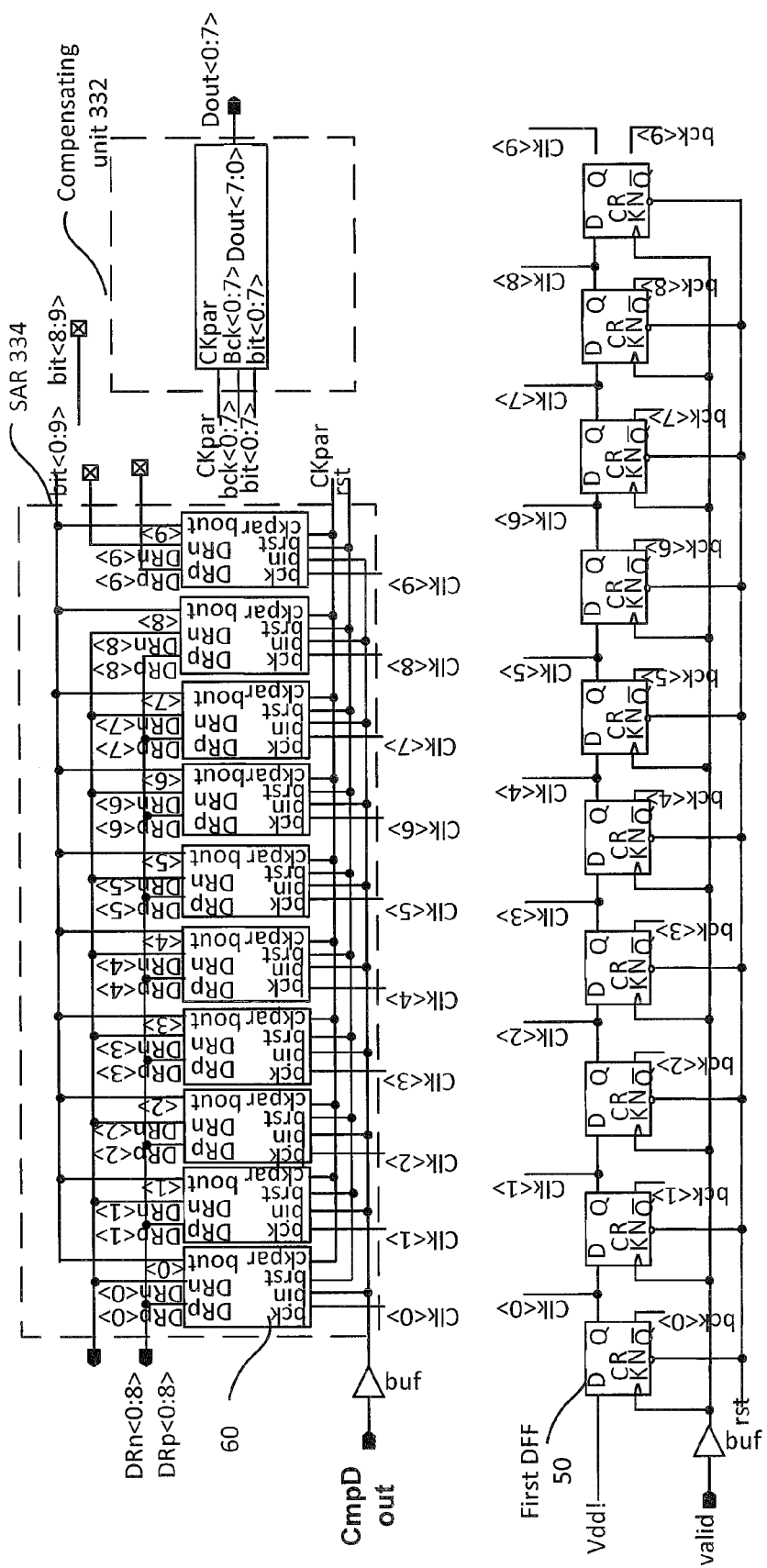
FIG. 5 is a diagram illustrating a specific implementation of partial units in the ADC according to an embodiment of the invention.

FIG. 5 is a diagram illustrating a specific implementation of partial units in the ADC according to an embodiment of the invention. The successive approximation register 334 comprises N number bit registers 60. The analog-to-digital converter 30 further comprises N number of first D-type flip flops (DFF) 50 connected in serial.

A clock port (clk) of each first DFF 50 receives the indication signal valid. A D port of the first DFF 50 for the MSB receives Vdd. A D port of each other first DFFs 50 is connected to a Q port of its previous first DFF 340. A Q port of each first DFF 50 is connected to a corresponding bit register 60 of the successive approximation register 334. A Q negative (QN) port of each first DFF 50 is connected to the compensating unit 332. A negative rest port (RN) of each first DFF 50 is configured to receive a reset signal (rst).

FIG. 6 is a diagram illustrating a circuit of a bit register according to an embodiment of the invention. As shown in FIG. 6, each of the bit registers 60 in the SAR 334 further comprises a second DFF 600, a first AND gate 610, a delay unit 620, a first buffer 630 and a second buffer 640. A D port of the second DFF 600 receives its corresponding comparison result (bin). A clock port of the second DFF 600 is connected to the Q port of corresponding first DFF 50 (bck), and the signals are shown as clk<0>, clk<1> . . . clk<9>. The delay unit 620 is also connected to the Q port of corresponding first DFF 50 (bck). A Q port of the second DFF 600 is connected to a first input port of the first AND gate 610. The delay unit 620 is connected to a second input port of the first AND gate 610. A third input port of the first AND gate 610 receives a bit reset signal (brst). A negative reset port of the second DFF also receives the bit reset signal (brst). A Q port of the second DFF 600 is connected to the first buffer 630. The output port of the first buffer 630 is connected to the second buffer 640. The output port of the first AND gate 610 is connected to the DAC 310, as shown in FIG. 3. The output signal of the second buffer 640 is shown as bit<0:9>, which is fed into the compensating unit 332.

In an embodiment, the compensating unit 334 compensates the current bit and all its less significant bits by resetting the current bit to 0 and resetting all its less significant bits to 1, when the indication signal indicates that the comparison result cannot be determined Prior to use, all bit registers have default values of 0.

FIG. 7 is a diagram illustrating a circuit of a compensating unit according to an embodiment of the invention. The compensating unit 70 further comprises a second AND gate 700, an OR gate 710, a third DFF 720 and a fourth DFF 730, a third buffer 740, a fourth buffer 750 and a fifth buffer 760.

A first input port and a second input port of the second AND gate 700 gate are connected to Q negative (QN) ports of first DFFs 50 for two neighboring bits. For example, bck<0> and bck<1> are signals of Q negative (QN) ports of first DFFs 50 for two neighboring bits, bck<1> and bck<2> are signals of Q negative (QN) ports of first DFFs 50 for two neighboring bits, and bck<2> and bck<3> are signals of Q negative (QN) ports of first DFFs 50 for two neighboring bits, etc. An output port of the second AND gate 700 is connected to a first input port of the OR gate 710. A second input port of the OR gate 700 is connected to a bit register for a less significant bit between the two neighboring bits. An output port of the OR gate 710 is connected to a D port of the third DFF 720. A Q port of the third DFF 720 is connected to the third buffer 740. The third buffer 740 is connected to the fourth buffer 750. A D port of the fourth DFF 730 is connected to the fifth buffer 760. The fifth buffer 760 is connected to the bit register for the most significant bit (MSB). The Q port of the fourth DFF 730 is connected to the third buffer 740. Both a clock port of the third DFF 720 and a clock port of the fourth DFF 730 are configured to receive a parallel clock (CKpar).

In FIG. 7, although only one second AND gate 700, one OR gate 710 and one third DFF 720 are shown in the drawings, those ordinary skill in the art can understand that there are a plurality of second AND gates 700, OR gates 710 and third DFFs 720. The signal input bck<1:7> means that signals bck<1>, bck<2>, bct<3> . . . bit<7> are respectively inputted into a corresponding second AND gate 700. In other words, the circuit comprises seven second AND gates 700, each receive a corresponding signal bck.

Figure 7A:
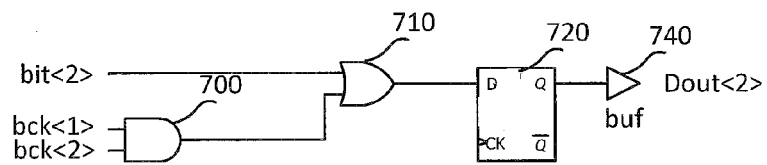
FIG. 7A is a diagram illustrating a second AND gate, an OR gate, a third DFF, and a third buffer of the ADC according to an embodiment of the invention.

In order to get a clearer picture of how the compensating unit 70 functions, two neighboring bits are described in details with reference to FIG. 7A. FIG. 7A shows the second AND gate 700, the OR gate 710, and the third DFF 720, the third buffer 740. The second gate AND 700 receives signals bck <1> and bck<2>. The OR gate 710 receives both the AND result from the second AND gate 700 and the bit<2> from the corresponding bit register. In normal situation, at least one of bck<2> and bck<1> is low, therefore, the dout<2> equals bit<2>. However, when Meta-stability occurs, both bck<1> and bck<2> are high, therefore, dout<2> is set to high (1). Both bck<1> and bck<2> are high, means metastablity occurs to both bit<1> and bit<2>. While all bit registers have default value of 0, and suppose bck<0> equals 0, dout <1> equals bit<1> which has the default value of 0. In other words, the output Dout<1> for current bit (bit<1>) remains 0, while the bit that is less significant than the current bit, that is bit<2>, is set to 1. The same rule applies to the other bits. In other words, all the less significant bits of the current bit are set to 1. To be more specific, if metastability occurs to bit<1>, then bit<1> is set to 0, while bit<2>, bit<3> to the least significant bit (LSB) are all set to 1.

Figure 8:
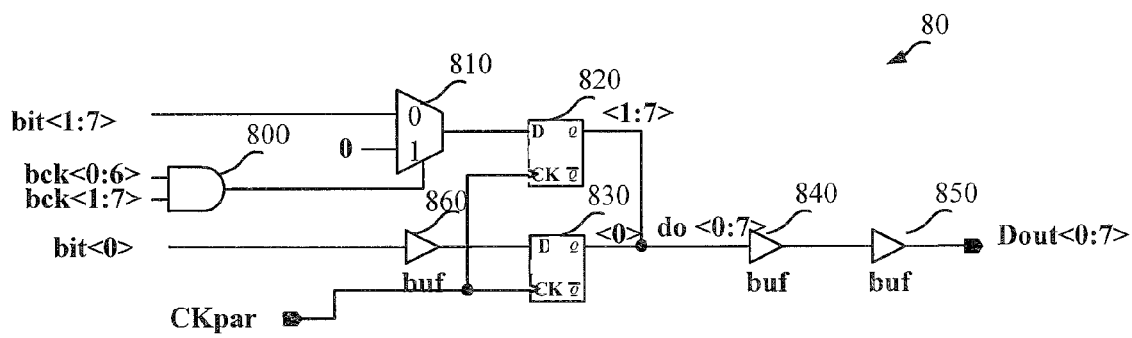
FIG. 8 is a diagram illustrating another ADC according to another embodiment of the invention.

FIG. 8 is a diagram illustrating another ADC according to another embodiment of the invention. Alternatively, the compensating unit compensates the current bit and all its less significant bits by setting the current bit to 1 and resetting all its less significant bits to 0, when the indication signal indicates that the comparison result cannot be determined Prior to use, all bit registers have a default value of 1.

Alternatively, the compensating unit 80 further comprises a second AND gate 800, a 2-to-1 multiplexer(MUX) 810, a third DFF 820 and a fourth DFF 830, a third buffer 840, a fourth buffer 850 and a fifth buffer 860. A first input port and a second input port of the second AND gate 800 are connected to Q negative (QN) ports of first DFFs 50 for two neighboring bits. An output port of the second AND gate 800 is connected to a selector port S of the MUX 810. A first input port of the MUX 810 is connected to a bit register for a less significant bit between the two neighboring bits. A second input port of the MUX is connected to ground (GND, 0). An output port of the MUX 810 is connected to a D port of the third DFF 820. A Q port of the third DFF 820 is connected to the third buffer 840. The third buffer 840 is connected to the fourth buffer 850. A D port of the fourth DFF 830 is connected to the fifth buffer 860. The fifth buffer 860 is connected to the bit register for the most significant bit (MSB). The Q port of the fourth DFF 830 is connected to the third buffer 840. Both a clock port of the third DFF 820 and a clock port of the fourth DFF 830 are configured to receive a parallel clock CKpar.

In FIG. 8, although only one second AND gate 800, one MUX gate 810 and one third DFF 820 are shown in the drawings, those ordinary skill in the art can understand that there are a plurality of second AND gates 800, MUX 810 and third DFFs 820. The signal input bck<1:7> means that signals bck<1>, bck<2>, bck<3> . . . , bck<7> are respectively inputted into a corresponding second AND gate 800. In other words, the circuit comprises seven second AND gates 800, each receive a corresponding signal bck.

Figure 8A:
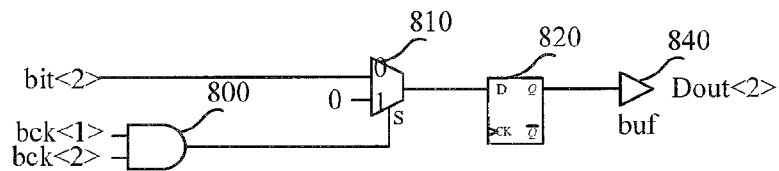
FIG. 8A is a diagram illustrating how the compensating unit 80 functions.

In order to get a clearer picture of how the compensating unit 80 functions, two neighboring bits are described in details with reference to FIG. 8A. FIG. 8A shows the second AND gate 800, MUX 810, the third DFF 820, the third buffer 840. The second gate AND gate 800 receives signals bck <1> and bck<2>, wherein bck<1> is the bit clock for the bit which is less significant than the MSB, and bck<2> is the bit clock for the bit which is less significant than that of bck<1>. The second AND gate 800 is connected to the selector port S of the MUX 810. One input port of the MUX 810 receives bit<2> from the corresponding bit register, and the other input port of the MUX 810 is connected to ground (0). An output port of the MUX 810 is connected to a D port of the third DFF 820. The MUX operates as follows, when the selector port S=0, the output of the MUX equals bit<2>, while when selector port S=1, the output of the MUX equals 0. Therefore, in normal situation, at least one of bck<2> and bck<1> is low, therefore, the dout<2> equals bit<2>. However, when Meta-stability occurs, both bck<1> and bck<2> are high, therefore, dout<2> is set to low (0). Both bck<1> and bck<2> are high, means metastablity occurs to both bit<1> and bit<2>. While all bit registers have default value of 1, and suppose bck<0> equals 0, dout <1> equals bit<1> which has the default value of 1. In other words, the output Dout<1> for current bit (bit<1>) remains 1, while the bit that is less significant than the current bit, that is bit<2>, is set to 0. The same rule applies to the other bits. In other words, all the less significant bits of the current bit are set to 0. To be more specific, if metastability occurs to bit<1>, then bit<1> is set to 1, and all of bit<2>, bit<3> to the least significant bit (LSB) are all set to 0.

Figure 9:
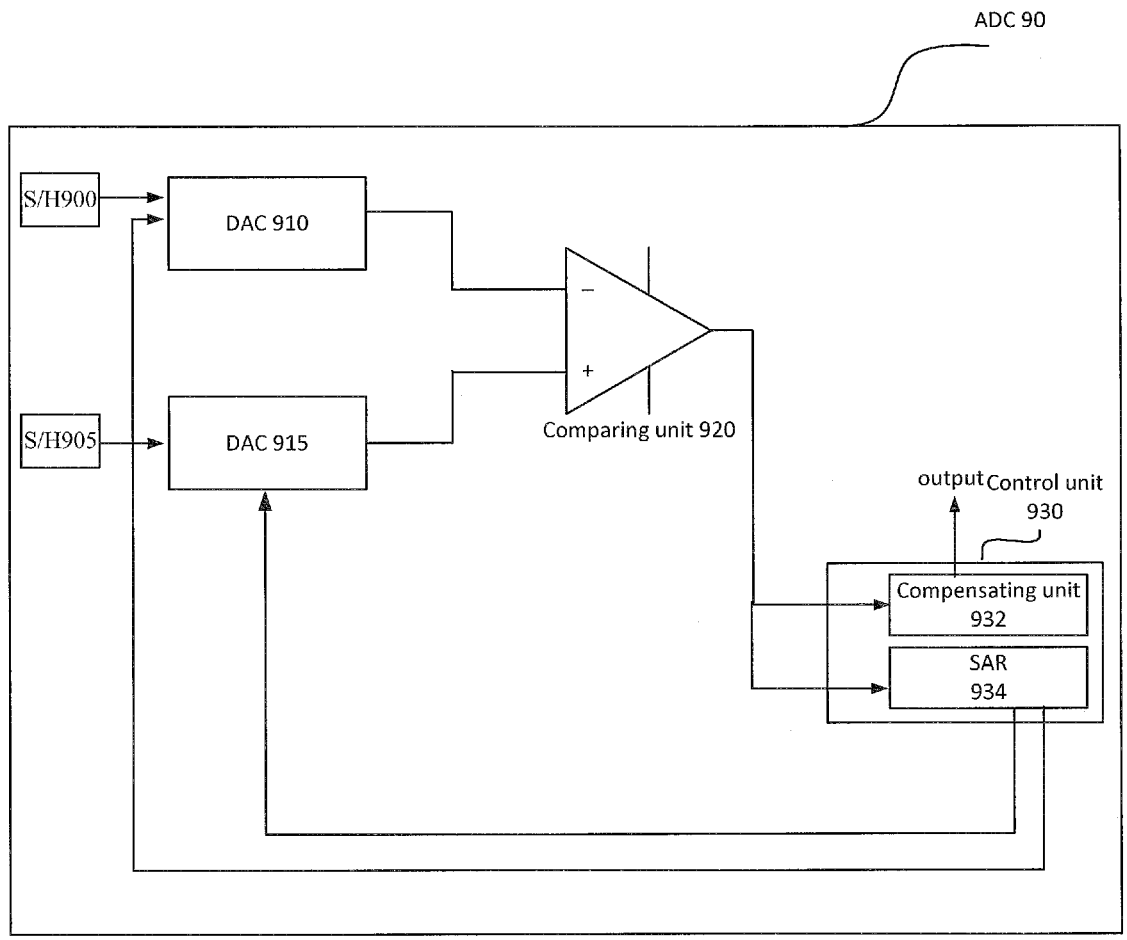
FIG. 9 is a block diagram illustrating an ADC according to another embodiment of the invention.

FIG. 9 is a block diagram illustrating an ADC according to another embodiment of the invention. In another embodiment, as shown in FIG. 9, an analog-to-digital converter (ADC) 90 comprises a first sample/hold unit 900, a second sampling unit 905, a first digital-to-analog converter 910, a second digital-to-analog converter 915, a comparing unit 920, and a control unit 930. The first sample/hold(S/H) unit 900 samples a first analog signal. The second sample/hold(S/H)

unit 905 samples a second analog signal. The first digital-to-analog converter (DAC) 910 is communicatively coupled to the first sample/hold unit 900 and the control unit 930, and receives a first feedback signal from the control unit 930 and the sampled first analog signal from the first sample/hold unit 900, and converts the difference between the sampled first analog signal and the first feedback signal to a third analog signal. The second digital-to-analog converter (DAC) 915 is communicatively coupled to the second sample/hold unit 905 and the control unit 930, receives a second feedback signal from the control unit 930 and the sampled second analog signal from the second sample/hold unit 905, and converts the difference between the sampled second analog signal and the second feedback signal to a fourth analog signal. The comparing unit 930 is communicatively coupled to the first digital-to-analog converter 910 and the second digital-to-analog converter 915, compares the third analog signal with the fourth analog signal, and generates an indication signal. The indication signal indicates whether a comparison result between the third analog signal and the fourth analog signal can be determined. The control unit 930 further comprises a compensating unit 932 communicatively coupled to the comparing unit 920 and compensates current bit and all its less significant bits, such that the sum of the current bit and all its less significant bits approximates a bit weight of the current bit, when the indication signal indicating that the first comparison result and the second comparison result cannot be determined. The compensating unit 932 further outputs compensated current bit and all its less significant bits together with more significant bits of the current bit. The control unit 930 further comprises a successive approximation register (SAR) 934 communicatively coupled to the comparing unit 920 and receives the comparison result from the comparing unit 920, stores the comparison result, generates the first feedback signal according to the first comparison result and generates the second feedback signal according to the second comparison result, and feeds the first feedback signal to first digital-to-analog converter 910, and feeds the second feedback signal to the second digital-to-analog converter 915, when the indication signal indicating that the first comparison result and the second comparison result can be determined.

The structure of the compensating unit 932 is similar to the compensating unit 332 shown in FIG. 3, and the detailed description for the compensating unit 932 is omitted for simplicity. The ADC 90 further comprises fifth DFFs (not shown in FIG. 9), which are similar to the first DFFs shown in FIG. 5. Therefore, the details of the fifth DFFs are not given for simplicity.

Figure 10:
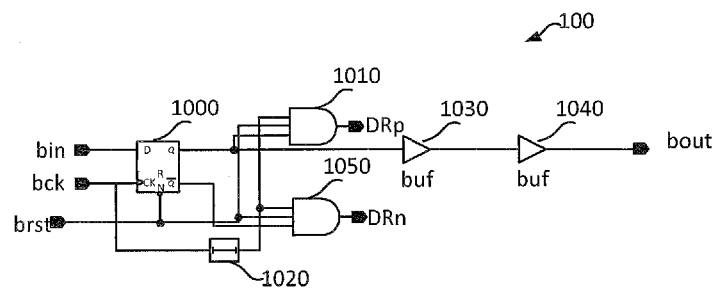
FIG. 10 is a diagram illustrating a detailed implementation embodiment of the successive approximation register according to an embodiment of the invention.

The successive approximation register (SAR) 934 for the ADC 90 is shown in more detail in FIG. 10. FIG. 10 is a diagram illustrating a detailed implementation embodiment of the bit register 100 in the successive approximation register 934 according to an embodiment of the invention. Compared with FIG. 6, in FIG. 10, units with reference numbers similar to those in FIG. 6 have similar functions and interrelationship. For example, the sixth DFF 1000 is similar to the second DFF 600 shown in FIG. 6, the third AND gate 1010 is similar to the first AND gate 610. The delay unit 1020 is similar to the delay unit 620. The sixth buffer 1030 is similar to the first buffer 630. The seventh buffer 1040 is similar to the second buffer 640. The fourth AND gate 1050 is new compared to FIG. 6. A Q negative port of the sixth DFF 1000 is connected to a first input port of the fourth AND gate 1050. The delay unit 1020 is connected to a second input port of the fourth AND gate 1050, a third input port of the fourth AND gate 1050 receives a bit reset signal; and the output port of the fourth AND gate is connected to the second DAC. In FIG. 10, it could be seen that two AND gates, including the third AND gate 1010 and the fourth AND gate 1050 are shown. The third AND gate outputs a positive feedback signal DRp to the first DAC, and the fourth AND gate outputs a negative feedback signal DRn to the second DAC.

Figure 11:
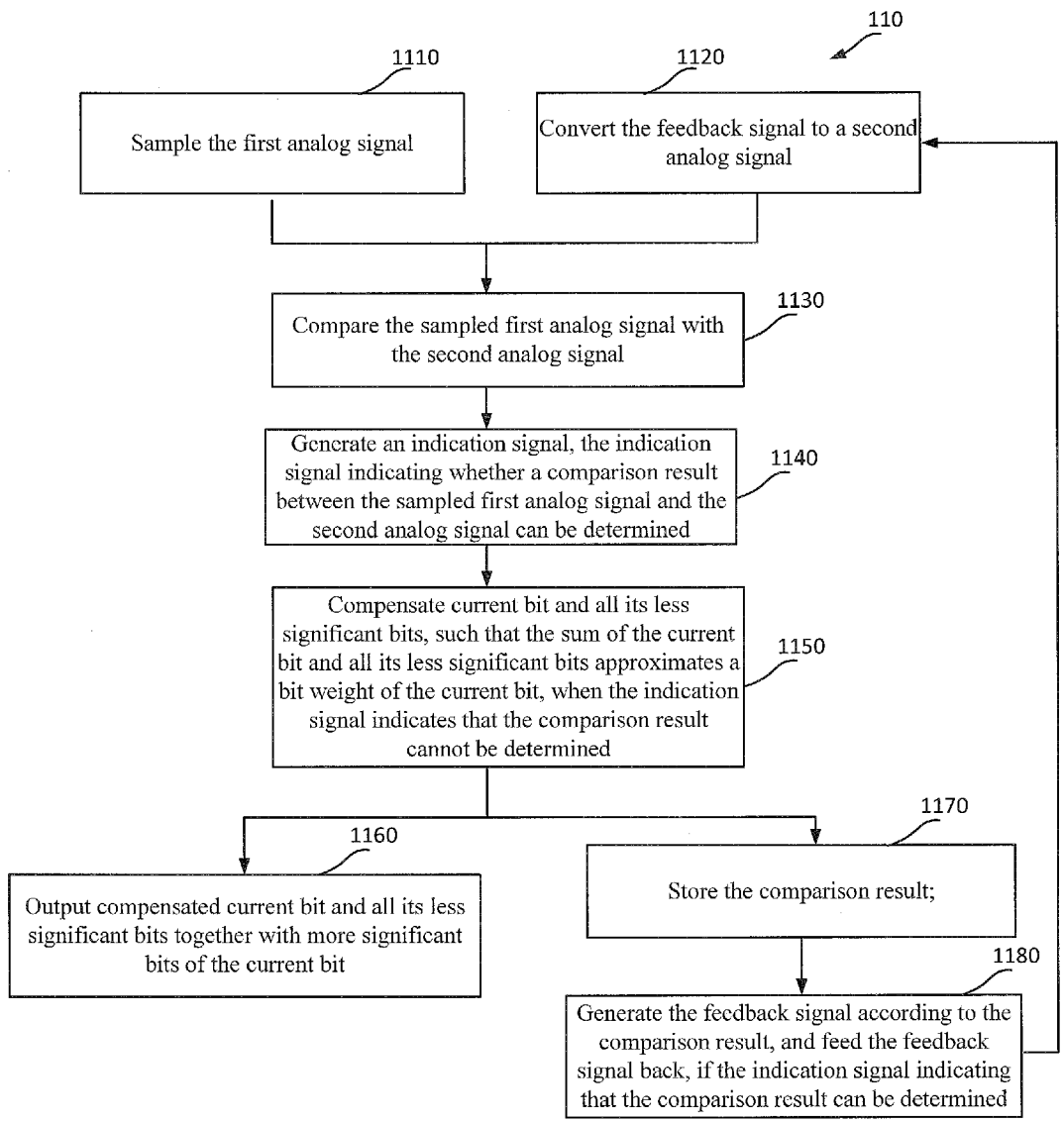
FIG. 11 is a flow chart illustrating a method of converting an analog signal to a digital signal according to an embodiment of the invention.

FIG. 11 is a flow chart illustrating a method of converting an analog signal to a digital signal according to an embodiment of the invention. In this embodiment, as shown in FIG. 11, a method 110 of converting an analog signal to a digital signal according to an embodiment of the invention is shown. The method 110 comprises sampling (in block 1110) the first analog signal; converting (in block 1120) the feedback signal to a second analog signal; comparing (in block 1130) the sampled first analog signal with the second analog signal; generating (in block 1140) an indication signal. The indication signal indicates whether a comparison result between the sampled first analog signal and the second analog signal can be determined. The method 110 further comprises compensating (in block 1150) current bit and all its less significant bits, such that the sum of the current bit and all its less significant bits approximates a bit weight of the current bit, when the indication signal indicates that the comparison result cannot be determined. The method 110 further comprises outputting (in block 1160) compensated current bit and all its less significant bits together with more significant bits of the current bit; storing (in block 1170) the comparison result; and generating (in block 1180) the feedback signal according to the comparison result, and feeding the feedback signal back, when the indication signal indicates that the comparison result can be determined. As shown in FIG. 11, the sampling (in block 1110) the first analog signal and the converting (in block 1120) do not have to be implemented in the order recited above. In other words, the 1110 and 1120 can be implemented substantially simultaneously or in different orders. Further, the outputting (in block 1160) and the storing (in block 1170) do not have to be implemented in the order recited above. In other words, the 1160 and 1170 can be implemented substantially simultaneously or in different orders.

It should be appreciated by those ordinary skill in the art that components from different embodiments may be combined to yield another technical solution. This written description uses examples to disclose the invention, including the best mode, and also to enable any person ordinary skill in the art to practice the invention, including making and using any devices or systems and performing any incorporated methods. The patentable scope of the invention is defined by the claims, and may include other examples that occur to those ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. An analog-to-digital converter (ADC), comprising a sample/hold (S/H) unit, a digital-to-analog converter (DAC), a comparing unit, and a control unit, wherein the sample/hold unit is configured to sample a first analog signal;

the digital-to-analog converter communicatively coupled to the control unit and configured to convert a feedback signal to a second analog signal;

the comparing unit is communicatively coupled to both the sample/hold unit and the digital-to-analog converter, and configured to compare the sampled first analog signal with the second analog signal, and generate an indication signal, the indication signal indicating whether a comparison result between the sampled first analog signal and the second analog signal can be determined;

wherein the control unit further comprises a compensating unit communicatively coupled to the comparing unit and configured to:

compensate a current bit corresponding to the comparison result and all its less significant bits, such that the sum of the current bit and all its less significant bits approximates a bit weight of the current bit, when the indication signal indicates that the comparison result cannot be determined, and output compensated current bit and all its less significant bits together with more significant bits of the current bit; and wherein the control unit further comprises a successive approximation register (SAR) communicatively coupled to the comparing unit and configured to:

receive the comparison result from the comparing unit, store the comparison result, generate the feedback signal according to the comparison result, and feed the feedback signal back to the digital-to-analog converter, when the indication signal indicates that the comparison result can be determined.

2. The analog-to-digital converter of claim 1, wherein the successive approximation register comprises N number bit registers, and the analog-to-digital converter further comprises:

N number first D-type flip flops (DFF) connected in serial, wherein a D port of each first DFF is configured to receive the indication signal, a Q port of each first DFF is connected to a corresponding bit register of the successive approximation register, and a Q negative (QN) port of each first DFF is connected to the compensating unit.

3. The analog-to-digital converter of claim 2, wherein each of the bit registers further comprises a second DFF, a first AND gate, a delay unit, a first buffer and a second buffer, wherein in each bit register, a D port of the second DFF receives its corresponding comparison result, a clock port of the second DFF is connected to a Q port of a corresponding first DFF, the delay unit is also connected to the Q port of the corresponding first DFF, a Q port of the second DFF is connected to a first input port of the first AND gate, the delay unit is connected to a second input port of the first AND gate, a third input port of the first AND gate is configured to receive a bit reset signal; output port of the first AND gate is connected to the DAC, a Q port of the second DFF is connected to the first buffer, and the output port of the first buffer is connected to a second buffer, and the output port of the second buffer is connected to the DAC.

4. The analog-to-digital converter of claim 3, wherein the compensating unit is configured to compensate the current bit and all its less significant bits by resetting the current bit to 0 and setting all its less significant bits to 1, when the indication signal indicates that the comparison result cannot be determined.

5. The analog-to-digital converter of claim 4, wherein the compensating unit further comprises a second AND gate, an OR gate, a third DFF and a fourth DFF, a third buffer, a fourth buffer and a fifth buffer, wherein a first input port and a second input port of the second AND gate are connected to a Q negative (QN) ports of first DFFs for two neighboring bits, and an output port of the second AND gate is connected to a first input port of the OR gate, a second input port of the OR gated is connected to a bit register for a less significant bit between the two neighboring bits, an output port of the OR gate is connected to a D port of the third DFF, a Q port of the third DFF is connected to the third buffer, and the third buffer is connected to the fourth buffer, a D port of the fourth DFF is connected to the fifth buffer, the fifth buffer is connected to the bit register for the most significant bit (MSB), the Q port of the fourth DFF is connected to the third buffer, both a clock port of the third DFF and a clock port of the fourth DFF are configured to receive a parallel clock.

6. The analog-to-digital converter of claim 3, wherein the compensating unit is configured to compensate the current bit and all its less significant bits by setting the current bit to 1 and resetting all its less significant bits to 0, when the indication signal indicates that the comparison result cannot be determined.

7. The analog-to-digital converter of claim 6, wherein the compensating unit further comprises a second AND gate, a 2-to-1 multiplexer(MUX), a third DFF and a fourth DFF, a third buffer, a fourth buffer and a fifth buffer, wherein a first input port and a second input port of the second AND gate are connected to a Q negative (QN) ports of first DFFs for two neighboring bits, and an output port of the second AND gate is connected to a selector port of the MUX, a first input port of the MUX is connected to a bit register for a less significant bit between the two neighboring bits, a second input port of the MUX is connected to ground(GND), an output port of the MUX is connected to a D port of the third DFF, a Q port of the third DFF is connected to the third buffer, and the third buffer is connected to the fourth buffer, a D port of the fourth DFF is connected to the fifth buffer, the fifth buffer is connected to the bit register for the most significant bit (MSB), the Q port of the fourth DFF is connected to the third buffer, both a clock port of the third DFF and a clock port of the fourth DFF are configured to receive a parallel clock.

8. An analog-to-digital converter (ADC), comprising a first sample/hold unit, a second sampling unit, a first digital-to-analog converter, a second digital-to-analog converter, a comparing unit, and a control unit, wherein the first sample/hold(S/H) unit is configured to sample a first analog signal;

the second sample/hold(S/H) unit is configured to sample a second analog signal;

the first digital-to-analog converter (DAC) is communicatively coupled to the first sample/hold unit and the control unit, and configured to receive a first feedback signal from the control unit and the sampled first analog signal, and convert the difference between the sampled first analog signal and the first feedback signal to a third analog signal;

the second digital-to-analog converter (DAC) is communicatively coupled to the second sample/hold unit and the control unit, and configured to receive a second feedback signal from the control unit and the sampled second analog signal, and convert the difference between the sampled second analog signal and the second feedback signal to a fourth analog signal;

the comparing unit is communicatively coupled to the first digital-to-analog converter and the second digital-to-analog converter and configured to compare the third analog signal with the fourth analog signal, and generate an indication signal, the indication signal indicating whether a comparison result between the third analog signal and the fourth analog signal can be determined;

wherein the control unit further comprises a compensating unit communicatively coupled to the comparing unit and configured to compensate current bit and all its less significant bits, such that the sum of the current bit and all its less significant bits approximates a bit weight of the current bit, when the indication signal indicating that the first comparison result and the second comparison result cannot be determined, and output compensated current bit and all its less significant bits together with more significant bits of the current bit; and wherein the control unit further comprises a successive approximation register (SAR) communicatively coupled to the comparing unit and configured to receive the comparison result from the comparing unit, store the comparison result, generate the first feedback signal according to the first comparison result and generate the second feedback signal according to the second comparison result, and feed the first feedback signal to the first digital-to-analog converter, and feed the second feedback signal to the second digital-to-analog converter, when the indication signal indicating that the first comparison result and the second comparison result can be determined.

9. The analog-to-digital converter of claim 8, wherein the successive approximation register comprises N number bit registers, and the analog-to-digital converter further comprises:

N number of fifth DFFs connected in serial, wherein a D port of each fifth DFF is configured to receive the indication signal, a Q port of each fifth DFF is connected to a corresponding bit register of the successive approximation register, and a Q negative (QN) port of each fifth DFF is connected to the compensating unit.

10. The analog-to-digital converter of claim 9, wherein each of the bit registers further comprises a sixth DFF, a third AND gate, a fourth AND gate, a delay unit, a sixth buffer and a seventh buffer, wherein in each bit register, a D port of the sixth DFF receives its corresponding comparison result, a clock port of the sixth DFF is connected to a Q port of a corresponding fifth DFF, the delay unit is also connected to the Q port of the corresponding fifth DFF, a Q port of the sixth DFF is connected to a first input port of the third AND gate, a Q negative port of the sixth DFF is connected to a first input port of the fourth AND gate, the delay unit is connected to both second input ports of the third AND gate and the fourth AND gate, third input ports of both the third AND gate and the fourth AND gate are configured to receive a bit reset signal; output port of the third AND gate is connected to the first DAC, output port of the fourth AND gate is connected to the second DAC, a Q port of the sixth DFF is connected to the sixth buffer, and the output port of the sixth buffer is connected to a seventh buffer.

11. A method of converting an analog signal to a digital signal, comprising:

sampling a first analog signal;

converting the feedback signal to a second analog signal;

comparing the sampled first analog signal with the second analog signal;

generating an indication signal, the indication signal indicating whether a comparison result between the sampled first analog signal and the second analog signal can be determined;

compensating current bit and all its less significant bits, such that the sum of the current bit and all its less significant bits approximates a bit weight of the current bit, when the indication signal indicates that the comparison result cannot be determined; outputting compensated current bit and all its less significant bits together with more significant bits of the current bit;

storing the comparison result; and generating the feedback signal according to the comparison result, and feeding the feedback signal back, when the indication signal indicates that the comparison result can be determined.

12. The method of claim 11, wherein the compensating current bit and all its less significant bits is implemented by compensating the current bit and all its less significant bits by resetting the current bit to 0 and setting all its less significant bits to 1, when the indication signal indicates that the comparison result cannot be determined.

13. The method of claim 11, wherein the compensating current bit and all its less significant bits is implemented by compensating the current bit and all its less significant bits by setting the current bit to 1 and resetting all its less significant bits to 0, when the indication signal indicates that the comparison result cannot be determined.

* * * * *